United States Patent
Pilankar et al.

(10) Patent No.: US 12,388,398 B2
(45) Date of Patent: Aug. 12, 2025

(54) OSCILLATOR FREQUENCY BASED ON MOBILITY AND PTAT TEMPERATURE COMPENSATION

(71) Applicant: TEXAS INSTRUMENTS INCORPORATED, Dallas, TX (US)

(72) Inventors: Prathamesh Pilankar, Mumbai (IN); Akhila Gundavarapu, Bangalore (IN); Dipankar Mandal, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/584,212

(22) Filed: Feb. 22, 2024

(65) Prior Publication Data

US 2025/0080047 A1    Mar. 6, 2025

(30) Foreign Application Priority Data

Sep. 1, 2023 (IN) .............................. 202341058650

(51) Int. Cl.
*H03B 5/04* (2006.01)
(52) U.S. Cl.
CPC ..................................... H03B 5/04 (2013.01)
(58) Field of Classification Search
CPC ......... H03B 5/04; H03K 3/011; H03K 3/0231

USPC ............................................. 331/108 C, 111
See application file for complete search history.

(56) References Cited

U.S. PATENT DOCUMENTS

| 11,300,989 B1* | 4/2022 | Shu ........................ H03K 17/22 |
| 2007/0205295 A1* | 9/2007 | Tran ................... G05D 23/1904 |
| | | 236/46 R |

* cited by examiner

*Primary Examiner* — Joseph Chang
(74) *Attorney, Agent, or Firm* — Charles F. Koch; Frank D. Cimino

(57) ABSTRACT

In an example, a system includes a first transistor having a first terminal coupled to a current mirror and a control terminal coupled to a first current source and a resistor. The system includes a second transistor having a first terminal coupled to the current mirror, a second terminal coupled to a second terminal of the first transistor, and a control terminal coupled to the resistor and a second current source. The system includes a third transistor having a first terminal coupled to a voltage terminal, a second terminal coupled to the control terminal of the second transistor, and a control terminal coupled to the first terminal of the second transistor. The system includes a fourth transistor having a control terminal coupled to the current mirror, first and second terminals coupled to one another and to the second terminal of the first transistor.

20 Claims, 5 Drawing Sheets

US 12,388,398 B2

OSCILLATOR FREQUENCY BASED ON MOBILITY AND PTAT TEMPERATURE COMPENSATION

CROSS-REFERENCE TO RELATED APPLICATIONS

The present application claims priority to India Provisional Patent Application No. 202341058650, which was filed Sep. 1, 2023, is titled "IMPROVED ACCURACY OF OSCILLATOR FREQUENCY BASED ON MOBILITY AND PTAT TEMPERATURE COMPENSATION," and is hereby incorporated herein by reference in its entirety.

BACKGROUND

Oscillators are electronic circuits that produce periodic signals such as sine waves, square waves, or triangle waves, at a given frequency. Linear or harmonic oscillators produce sinusoidal or near-sinusoidal waves. Relaxation oscillators produce non-sinusoidal output signals, such as square waves, triangle waves, or sawtooth waves. The frequency of many relaxation oscillators is proportional to the resistance and capacitance in the electronic circuit.

SUMMARY

In accordance with at least one example of the description, a system includes a first transistor having a control terminal and first and second terminals, the first terminal coupled to a current mirror and the control terminal coupled to a first current source and a resistor. The system also includes a second transistor having a control terminal and first and second terminals, the first terminal coupled to the current mirror, the second terminal coupled to the second terminal of the first transistor, and the control terminal coupled to the resistor and a second current source. The system includes a third transistor having a control terminal and first and second terminals, the first terminal coupled to a voltage terminal, the second terminal coupled to the control terminal of the second transistor, and the control terminal coupled to the first terminal of the second transistor. The system includes a fourth transistor having a control terminal and first and second terminals, the control terminal coupled to the current mirror, the first and second terminals coupled to one another and to the second terminal of the first transistor and the second terminal of the second transistor.

In accordance with at least one example of the description, a system includes a first transistor having a control terminal and first and second terminals, the first terminal coupled to a current mirror and the control terminal coupled to a first current source and a resistor. The system also includes a second transistor having a control terminal and first and second terminals, the first terminal coupled to the current mirror, the second terminal coupled to the second terminal of the first transistor, and the control terminal coupled to the resistor and a second current source. The system includes a third transistor having a control terminal and first and second terminals, the first terminal coupled to a voltage terminal, the second terminal coupled to the control terminal of the second transistor, and the control terminal coupled to the first terminal of the second transistor. The system includes a fourth transistor having a control terminal and first and second terminals, the control terminal coupled to the current mirror, the first and second terminals coupled to one another and to the second terminal of the first transistor and the second terminal of the second transistor. The system also includes a comparator having a comparator output and first and second comparator inputs, where the control terminal of the fourth transistor is coupled to the first comparator input.

In accordance with at least one example of the description, a system includes a first transistor having a control terminal and first and second terminals, the first terminal coupled to a current mirror and the control terminal coupled to a first current source and a resistor, the first current source configured to provide a proportional to absolute temperature (PTAT) current. The system also includes a second transistor having a control terminal and first and second terminals, the first terminal coupled to the current mirror, the second terminal coupled to the second terminal of the first transistor, and the control terminal coupled to the resistor and a second current source. The system includes a third transistor having a control terminal and first and second terminals, the first terminal coupled to a voltage terminal, the second terminal coupled to the control terminal of the second transistor, and the control terminal coupled to the first terminal of the second transistor. The system also includes a fourth transistor having a control terminal and first and second terminals, the control terminal coupled to the current mirror, the first and second terminals coupled to one another and to the second terminal of the first transistor and the second terminal of the second transistor, the fourth transistor configured to receive a first current from the current mirror at its control terminal. The system includes a comparator having a comparator output and first and second comparator inputs, where the control terminal of the fourth transistor is coupled to the first comparator input, and where the comparator is configured to compare a voltage at the control terminal of the fourth transistor to a reference voltage.

BRIEF DESCRIPTION OF THE DRAWINGS

The same reference numbers or other reference designators are used in the drawings to designate the same or similar (functionally and/or structurally) features.

DETAILED DESCRIPTION

A relaxation oscillator is a non-linear oscillator that produces a non-sinusoidal output signal, such as a triangle wave or a square wave. Relaxation oscillators often use a switching device (such as a transistor or a comparator) that repeatedly charges and discharges a capacitor or inductor through a resistance. The frequency of the oscillator depends on the time constant of the circuit. The time constant characterizes the response of the circuit to a step input. In a resistor-capacitor (RC) based oscillator, the time constant and the frequency of the oscillator are proportional to the values of R and C.

In some semiconductor manufacturing processes, the value of resistances may vary 10-15% from the designed value. The value of capacitances may vary by 10% from the designed value. The combined variances of the resistances and capacitances may result in the variation in frequency of an oscillator by around 25%. To improve the frequency of the oscillator responsive to these variations, trim bits may be useful. However, trim bits use additional area on the chip, trim circuitry, memory cells, and other components. Trim bits also add to testing time and testing cost.

In examples herein, a relaxation oscillator architecture is described, where the frequency of the oscillator is dependent on electron mobility ($\mu$) rather than R and C. Electron mobility is a single parameter rather than two parameters (such as R and C), and is more easily controlled for a given manufacturing process. The examples herein also describe a circuit that can compensate for a variety of temperature coefficients of the manufacturing process. The examples herein show a relaxation oscillator that produces a square wave, but other examples may produce other types of oscillating output signals.

Figure 1:
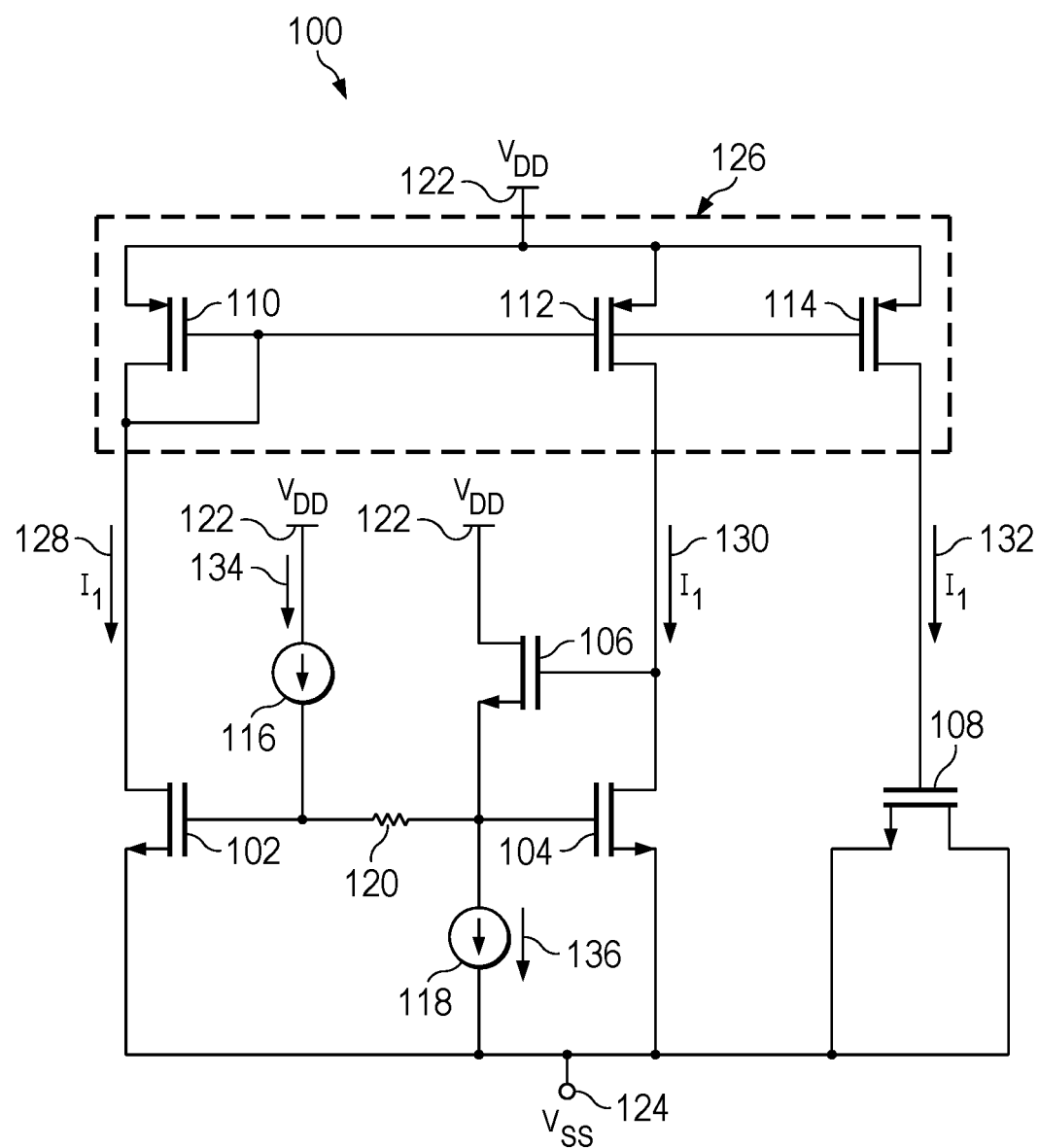
FIG. 1 is a core of a relaxation oscillator with a frequency dependent on electron mobility in accordance with various examples.

FIG. 1 is a core 100 of a relaxation oscillator with a frequency dependent on electron mobility in accordance with various examples herein. In an example, a circuit provides a current to a transistor configured as a capacitor (e.g. a metal-oxide semiconductor (MOS) capacitor). The temperature variation is cancelled by using a bias current that is proportional to absolute temperature (PTAT) in core 100. In other examples described below, a divider in the oscillator circuit produces a linear temperature coefficient, which may be compensated by changing a reference voltage of the oscillator proportional to temperature.

Core 100 includes transistors 102, 104, 106, 108, 110, 112, and 114. Core 100 also includes current sources 116 and 118, and resistor 120. Core 100 includes voltage terminals 122 and 124. Core 100 includes current mirror 126. A number of currents are also shown in core 100, such as currents 128, 130, 132, 134, and 136.

In core 100, transistors 102, 104, 106, 108, 110, 112, and 114 are field effect transistors (FETs). The transistors may be metal-oxide semiconductor FETs (MOSFETs) in one example. In other examples, other types of transistors may be useful. In this example, transistors 102, 104, 106, and 108 are n-channel FETs, and transistors 110, 112, and 114 are p-channel FETs. For the transistors described herein, a gate terminal may be referred to as a control terminal. The source and drain terminals of the transistor may be referred to herein as a first terminal or a second terminal (or vice versa).

Transistor 102 has a gate, a source, and a drain. The gate (e.g., the control terminal) is coupled to a first terminal of current source 116 and a first terminal of resistor 120. The drain of transistor 102 (e.g., the first terminal) is coupled to transistor 110 in current mirror 126. The source (e.g., the second terminal) of transistor 102 is coupled to voltage terminal 124, current source 118, the source of transistor 104, and the source and drain of transistor 108. Voltage terminal 124 may provide a voltage VSS, which may be any suitable value, including ground.

Transistor 104 has a gate (e.g., the control terminal) coupled to the second terminal of resistor 120, a first terminal of current source 118, and a source of transistor 106. The drain of transistor 104 (e.g., the first terminal) is coupled to the gate of transistor 106 and to transistor 112 in current mirror 126. The source of transistor 104 (e.g., the second terminal) is coupled to voltage terminal 124, the second terminal of current source 118, the source of transistor 102, and the source and drain of transistor 108.

Transistor 106 is configured as a source follower in this example. Transistor 106 has a gate (e.g., the control terminal) coupled to the drain of transistor 104 and transistor 112 in current mirror 126. The drain of transistor 106 (e.g., the first terminal) is coupled to voltage terminal 122. The source of transistor 106 (e.g., the second terminal) is coupled to the first terminal of current source 118.

Transistor 108 has a gate (e.g., the control terminal) coupled to the drain of transistor 114 in current mirror 126. Transistor 108 has a drain (e.g., a first terminal) and a source (e.g., a second terminal) coupled to one another and coupled to voltage terminal 124. Transistor 108 is configured as a MOS capacitor. One terminal of the MOS capacitor is the gate of transistor 108, and the other terminal is the source and drain of transistor 108. The capacitance of the MOS capacitor depends on the voltage at the gate terminal. The source and drain of transistor 108 may be coupled to ground in one example.

Transistors 110, 112, and 114 make up current mirror 126. Transistor 110 has a gate (e.g., a control terminal) coupled to the gate of transistor 112 and to the drain (e.g., the first terminal) of transistor 110. Transistor 110 has a source (e.g., a second terminal) coupled to voltage terminal 122. Transistor 112 has a gate (e.g., a control terminal) coupled to the gates of transistors 110 and 114. Transistor 112 has a drain (e.g., a first terminal) coupled to the gate of transistor 106 and the drain of transistor 104. Transistor 112 has a source (e.g., a second terminal) coupled to voltage terminal 122. Transistor 114 has a gate (e.g., a control terminal) coupled to the gate of transistor 112. Transistor 114 has a drain (e.g., a first terminal) coupled to the gate of transistor 108. Transistor 114 has a source (e.g., a second terminal) coupled to voltage terminal 122.

First current source 116 has a first terminal coupled to the gate of transistor 102 and resistor 120. First current source 116 has a second terminal coupled to voltage terminal 122. Second current source has a first terminal coupled to the source of transistor 106 and a second terminal coupled to voltage terminal 124. Resistor 120 has a first terminal coupled to the gate of transistor 102 and a second terminal coupled to the gate of transistor 104.

In an example herein, voltage terminal provides a voltage $V_{DD}$, and voltage terminal 124 provides a voltage $V_{SS}$. $V_{SS}$ may be ground in one example. First current source 116 provides a current 134 that is a PTAT current ($I_{PTAT}$). Second current 118 provides a current 136. Current 136 may be larger than current 134, such as at least twice as large in one example. In one example, transistor 110, 112, and 114 are approximately the same size. In an example, transistor 104 has a width to length ratio approximately four times the width to length ratio of transistor 102.

In an example operation, current mirror provides currents 128, 130, and 132. These currents are similar in size and may have a value of $I_1$. Current sources 116 and 118 provide bias currents that bias transistors 102 and 104, and current source 118 provides bias current for transistor 106. Current 132 is provided to transistor 108, the MOS capacitor. The voltage at the gate of transistor 108 is provided to a comparator (not shown in FIG. 1), and switches (not shown in FIG. 1) charge and discharge the MOS capacitor to provide an oscillating output signal. The switches and comparator and their operation are described below with respect to FIG. 2.

Core 100 is able to produce an oscillating signal with a frequency based on electron mobility ($\mu$) based on the following equations. In these equations, transistor 102 is referred to as MN1, transistor 104 as MN2, transistor 110 as MP1, and transistor 112 as MP2. The current through transistor MP2 (transistor 112) is current 130 in FIG. 1. This current is defined in Equation (1):

$$I_{MP2} = \frac{1}{2}\mu c_{OX}\frac{4W_{MN1}}{L_{MN1}}(V_{gs2} - V_{th})^2 \quad (1)$$

In Equation (1), $\mu$ is the electron mobility of the process, $c_{OX}$ is the oxide capacitance of the process, $W_{MN1}$ is the width of transistor 102 (MN1), $L_{MN1}$ is the length of transistor 102, $V_{gs2}$ is the gate to source voltage of transistor 104 (MN2), and $V_{th}$ is the threshold voltage of transistor 104. As noted above, the W/L ratio of transistor 104 is four times the W/L ratio of transistor 102 in this example, so $4W_{MN1}=W_{MN2}$, and $L_{MN1}=L_{MN2}$.

Equation (2) is the current through MP1 (transistor 110):

$$I_{MP1} = \frac{1}{2}\mu c_{OX}\frac{W_{MN1}}{L_{MN1}}(V_{gs2} + I_{PTAT}R - V_{th})^2 \quad (2)$$

As seen in Equation (2), the voltage values in parentheses now include the $I_{PTAT}$ Current (current 134) times the resistance R, which is the resistance of resistor 120. Current mirror 126 provides that currents 128 and 130 are equal, and therefore $I_{MP1}=I_{MP2}$. The difference between the gate to source voltages of transistor 102 and transistor 104 is $I_{PTAT}R$. Because $I_{MP1}=I_{MP2}$, Equation (2) may be rewritten as Equation (3):

$$I_{MP2} = \frac{1}{2}\mu c_{OX}\frac{4W_{MN1}}{L_{MN1}}(I_{PTAT}R)^2 \quad (3)$$

As described above, transistor 108 is configured as a MOS capacitor. The capacitance value of the MOS capacitor may be referred to herein as $C_1$. The capacitance value $C_1$ is given by Equation (4):

$$C_1 = C_{OX}(W_{C1} * L_{C1}) \quad (4)$$

In Equation (4), $c_{OX}$ is the oxide capacitance of the process, $W_{C1}$ is the width of the MOS capacitor (transistor 108), and $L_{C1}$ is the length of the MOS capacitor. The delta voltage (e.g., the change in voltage) $\Delta V_{C1}$ across the MOS capacitor caused by the current 132 flowing into the MOS capacitor is given by Equation (5):

$$\Delta V_{C1} = \frac{I_{MP1}}{C_1} * t \quad (5)$$

where $I_{MP1}$ is the value of current 132, $C_1$ is the capacitance value from Equation (4), and t is time. Substituting for $I_{MP1}$ and $C_1$ in Equation (5) produces Equation (6):

$$\Delta V_{C1} = \frac{\mu\frac{2*W_{MN1}}{L_{MN1}}(I_{PTAT}R_1)^2}{W_{C1}L_{C1}} * t \quad (6)$$

where $R_1$ is the value of resistor 120. Rewriting Equation (6) to solve for frequency f (e.g., 1/t), yields Equation (7):

$$f = \Delta V_{C1} * \frac{W_{C1}L_{C1}}{\mu\frac{2*W_{MN1}}{L_{MN1}}(I_{PTAT}R_1)^2} \quad (7)$$

In Equation (7), frequency f is dependent on electron mobility and bias current $I_{PTAT}$, which both have temperature variation. The temperature variation may be cancelled by using a temperature proportional bias current ($I_{PTAT}$), as shown in the following equations. First, the example manufacturing process described herein has an electron mobility of about 2.2. Therefore, the electron mobility and its relationship to temperature is shown in Equation (8):

$$\mu = \mu_0 * T^{-2.2} \quad (8)$$

where $\mu_o$ is the standard electron mobility and T is temperature. The $I_{PTAT}$ current is shown in Equation (9):

$$I_{PTAT} = \frac{\Delta V_{BE}}{R} \quad (9)$$

where $\Delta V_{BE}$ is proportional to temperature T. Also, it follows from Equation (9) that $(\Delta V_{BE})^2$ is proportional to temperature $T^2$. From Equation (6), if electron mobility $\mu$ is proportional to $T^{-2.2}$, and $I_{PTAT}^2$ is proportional to $T^2$ (via $\Delta V_{BE}$), then $V_{C1}$ is proportional to $T^{-0.2}$. Therefore, temperature cancellation is achieved. The temperature variation of electron mobility and bias current $I_{PTAT}$ approximately cancel each other out. Equation (6) may be rewritten as Equation (10):

$$\Delta V_{C1} = \frac{\mu\frac{2*W_{MN1}}{L_{MN1}}\left(\frac{\Delta V_{BE}}{R}*R_1\right)^2}{W_{C1}L_{C1}} * t \quad (10)$$

Equation (7) may be rewritten as Equation (11):

$$f = \Delta V_{C1} * \frac{W_{C1}L_{C1}}{\mu\frac{2*W_{MN1}}{L_{MN1}}\left(\frac{\Delta V_{BE}}{R}*R_1\right)^2} \quad (11)$$

The process described above provides temperature cancellation if the manufacturing process has a temperature coefficient of about 2 (e.g., about 2.2 in one example). However, other processes may have different temperature coefficients. If a process has a temperature coefficient that differs from 2, an alternative circuit may be useful for providing temperature compensation. One alternative circuit that compensates for a variety of temperature coefficients is described below with respect to FIG. 4.

Figure 2:
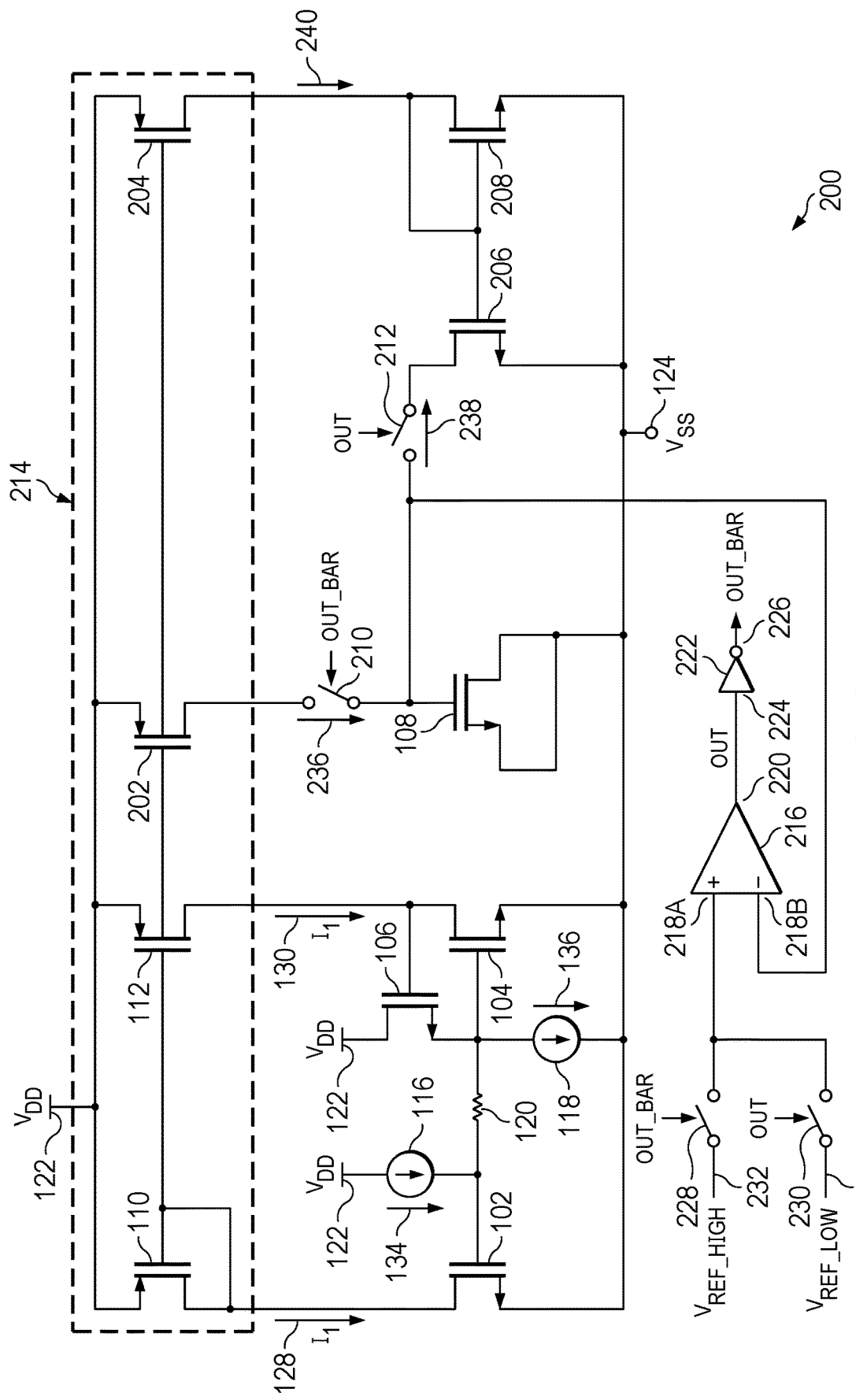
FIG. 2 is a relaxation oscillator in accordance with various examples.

FIG. 2 is a relaxation oscillator 200 in accordance with various examples herein. Relaxation oscillator 200 includes many of the components of core 100 described above, and also includes additional components such as a comparator and switches to produce an oscillating output. The oscillating output in this example is a square wave that can be programmed to have a variety of duty cycles. Other types of oscillating outputs may be produced in other examples.

Relaxation oscillator 200 includes transistors 102, 104, 106, 108, 110, and 112. Relaxation oscillator 200 also includes current sources 116 and 118, and resistor 120. Relaxation oscillator 200 includes voltage terminals 122 and 124. A number of currents are also shown in relaxation oscillator 200, such as currents 128, 130, 134, and 136.

Relaxation oscillator 200 also includes transistors 202, 204, 206, and 208. In this example, transistors 202 and 204 are p-channel FETs, and transistors 206 and 208 are n-channel FETs. Relaxation oscillator 200 includes switches 210 and 212. Relaxation oscillator 200 includes current mirror 214. Relaxation oscillator 200 includes comparator 216 that has first comparator input 218A, second comparator input 218B, and comparator output 220. Relaxation oscillator 200 includes inverter 222, which has inverter input 224 and inverter output 226. Relaxation oscillator 200 also includes switches 228 and 230, voltage terminals 232 and 234 (e.g., voltage reference terminals), and currents 236, 238, and 240.

The components of relaxation oscillator 200 that are found in core 100 are configured and operate as described above with respect to FIG. 1. These components include transistors 102, 104, 106, 108, 110, and 112, current sources 116 and 118, resistor 120, voltage terminals 122 and 124, and currents 128, 130, 134, and 136. The additional components of relaxation oscillator 200 are described below.

Transistor 202 has a control terminal (e.g., a gate) coupled to the control terminal of transistors 112 and 204, a first terminal (e.g., a drain) coupled to a first terminal of switch 210, and a second terminal (e.g., a source) couple to voltage terminal 122. Transistor 204 has a control terminal (e.g., a gate) coupled to the control terminal of transistor 202, a first terminal (e.g., a drain) coupled to a first terminal of transistor 208, and a second terminal (e.g., a source) couple to voltage terminal 122. Transistors 110, 112, 202, and 204 make up current mirror 214. In one example, transistors 110 and 112 are approximately the same size. Transistor 204 may be approximately four times as large as transistor 202 in one example.

Transistor 206 has a control terminal (e.g., a gate) coupled to the control terminal of transistor 208. Transistor 206 has a first terminal (e.g., a drain) coupled to a first terminal of switch 212. Transistor 206 has a second terminal (e.g., a source) coupled to voltage terminal 124 and a second terminal of transistor 208.

Transistor 208 has a control terminal (e.g., a gate) coupled to its first terminal (e.g., a drain) and to the control terminal of transistor 206. Transistor 208 has a first terminal coupled to its control terminal and to the first terminal of transistor 204. Transistor 208 has a second terminal (e.g., a source) coupled to voltage terminal 124 and a second terminal of transistor 206. Transistors 206 and 208 are configured as a current mirror in one example.

Switch 210 has a first terminal coupled to the drain of transistor 202 and a second terminal coupled to the gate of transistor 108. Switch 212 has a first terminal coupled to the drain of transistor 206 and a second terminal coupled to the gate of transistor 108. The gate of transistor 108 is also coupled to comparator 216 (e.g., the second comparator input 218B of comparator 216).

Comparator 216 has a first comparator input 218A, a second comparator input 218B, and a comparator output 220. First comparator input 218A is coupled to switches 228 and 230. Second comparator input 218B is coupled to the gate of transistor 108 and switches 210 and 212. Comparator output 220 is coupled to inverter input 224.

Inverter 222 has an inverter input 224 and an inverter output 226. Comparator 216 produces an OUT signal at comparator output 220. The OUT signal is received by inverter 222 at inverter input 224. Inverter 222 produces an OUT_BAR signal at inverter output 226. The OUT and OUT_BAR signals are inverse from one another. The OUT and OUT_BAR signals are used for switching switches 210, 212, 228, and 230 as described below.

Switch 228 has a first terminal coupled to first comparator input 218A and a second terminal coupled to voltage terminal 232. Voltage terminal 232 provides a voltage $V_{REF\_HIGH}$. Switch 230 has a first terminal coupled to first comparator input 218A and a second terminal coupled to voltage terminal 234. Voltage terminal 234 provides a voltage $V_{REF\_LOW}$. The voltages $V_{REF\_HIGH}$ and $V_{REF\_LOW}$ provide the duty cycle of the relaxation oscillator 200 as described below.

In operation, comparator 216 toggles the charging and discharging currents provided to transistor 108 as the voltage at the gate of transistor 108 reaches $V_{REF\_HIGH}$ or $V_{REF\_LOW}$. First, the OUT_BAR signal closes switches 210 and 228. The OUT signal opens switches 212 and 320. Current mirror 214 provides a current 236 to the gate of transistor 108 if switch 210 is closed. Current 236 may be similar in size to currents 128 and 130 in one example. Transistor 108 is a MOS capacitor, so current 236 charges the capacitor. If switch 228 is closed, the voltage value $V_{REF\_HIGH}$ is provided to first comparator input 218A via switch 228. Because $V_{REF\_HIGH}$ is a higher value than the charge at the gate of transistor 108 at this time (while transistor 108 is charging), comparator output 220 provides $V_{REF\_HIGH}$ at its Output. $V_{REF\_HIGH}$ is a static high voltage value, while the voltage value at second comparator input 218B is a lower but rising value.

After current 236 charges the voltage value at the gate of transistor 108, this voltage value provided to second comparator input 218B becomes greater than $V_{REF\_HIGH}$, causing comparator output 220 to switch. If comparator output 220 switches, the switches controlled by OUT close (switches 212 and 230), and the switches controlled by OUT_BAR open (switches 210 and 228). With switch 230 closed and switch 228 open, the voltage $V_{REF\_LOW}$ is provided to first comparator input 218A. With switch 212 closed and switch 210 open, transistor 108 stops charging and begins discharging. Current 238 through switch 212 discharges the voltage at the gate of transistor 108. Current 240 flows through transistor 208 towards voltage terminal 124, and the current mirror of transistors 206 and 208 also pull current 238 from the gate of transistor 108 through switch 212 and towards voltage terminal 124. Current 238 therefore discharges the MOS capacitor of transistor 108.

During discharge, the voltage at the gate of transistor 108 drops. This voltage is provided to second comparator input 218B, and eventually drops to a value lower than $V_{REF\_LOW}$, which is provided to first comparator input 218A. If the voltage at the gate of transistor 108 drops below $V_{REF\_LOW}$, the comparator output 220 switches. If comparator output 220 switches, switches 212 and 230 open, and switches 210 and 228 close. With switch 210 closed, the voltage at the gate of transistor 108 begins charging again via current 236. With switch 228 closed, the voltage $V_{REF\_HIGH}$ is provided to first comparator input 218A. Therefore, the charging and discharging cycle repeats, and the switching occurs at the voltage values set by $V_{REF\_HIGH}$ and $V_{REF\_LOW}$.

The voltages $V_{REF\_HIGH}$ and $V_{REF\_LOW}$ may be set to any suitable values to provide the high and low values for the oscillating output signal of the relaxation oscillator 200. The oscillating output signal is provided at comparator output 220. The voltage at the gate of transistor 108 charges until it reaches $V_{REF\_HIGH}$, and discharges until it reaches $V_{REF\_LOW}$. The ratio of the sizes of transistor 202 and 204 may be selected to provide a given duty cycle for the oscillating output signal. Current 236 charges transistor 108, and current 240 discharges transistor 108. Therefore, if current 240 is four times as large as current 236, transistor 108 will discharge four times as fast as it charges, to provide a duty cycle of 80%. If, in another example, transistors 202 and 204 are equal in size, then currents 236 and 240 are approximately equal in size. In this example, transistor 108 charges at about the same rate that it discharges, providing a duty cycle of 50%. Example voltage waveforms are described below with respect to FIG. 3.

Figure 3:
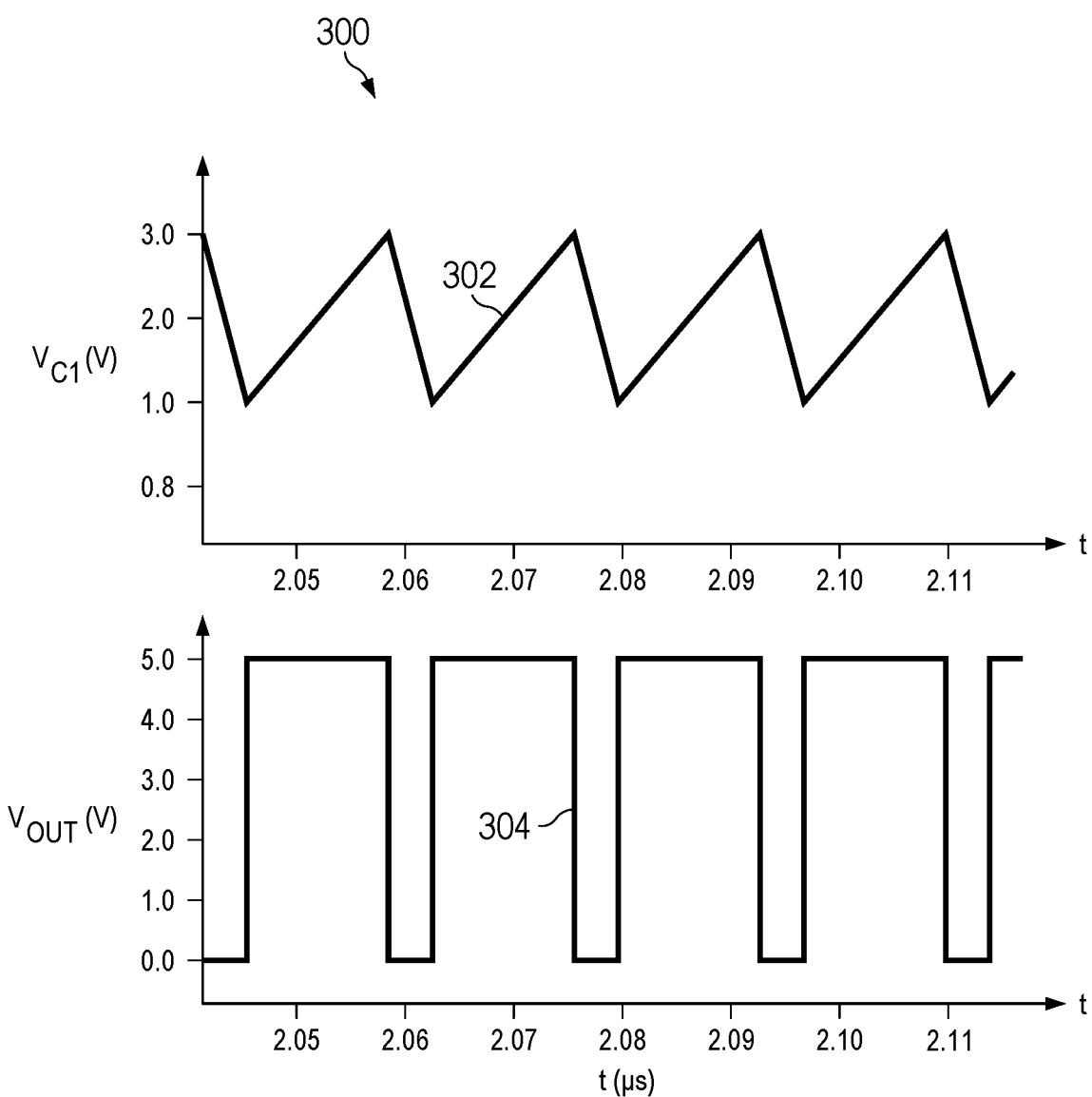
FIG. 3 is a graph of waveforms for a relaxation oscillator in accordance with various examples.

FIG. 3 is a graph 300 of waveforms for a relaxation oscillator in accordance with various examples herein. The relaxation oscillator may be relaxation oscillator 200 in one example. Graph 300 includes two waveforms, waveform 302 and waveform 304. In graph 300, the x-axis is time in milliseconds, and the y-axis is voltage in volts.

Waveform 302 is the voltage at the gate of transistor 108, referred to here as $V_{C1}$. This is the voltage that is provided to second comparator input 218B. $V_{C1}$ is a voltage that is charged and discharged via switches 210 and 212 as described above. In this example, $V_{C1}$ charges to about 3.0 V, and discharges to about 1.0 V. $V_{REF\_HIGH}$ is set to 3.0 V, and $V_{REF\_LOW}$ is set to 1.0 V. Waveform 302 shows that $V_{C1}$ charges more slowly than it discharges. As described above, the relative lengths of time of the charge and discharge cycles provides the duty cycle for the oscillating output signal. A larger charging time creates a higher duty cycle in this example. The example in FIG. 3 has a duty cycle of about of 80%, so the charging time is four times as long as the discharging time. The charging and discharging times may be set by the relative current values of currents 236 and 240. In FIG. 2, current 240 is approximately four times as large as current 236, due to transistor 204 being approximately four times as large as transistor 202. Therefore, the duty cycle is 4:1, or 80%.

Waveform 304 is the voltage $V_{OUT}$ at the output 220 of comparator 216 in one example (e.g., the OUT signal). Comparator 216 produces the OUT signal that extends between approximately 5.0 V and 0.0 V. The OUT signal has an 80% duty cycle in this example. As seen in waveform 304, $V_{OUT}$ is high while $V_{C1}$ is charging, and $V_{OUT}$ is low while $V_{C1}$ is discharging. As $V_{C1}$ charges, comparator 216 produces a high output signal at 5.0 V. The signal at first comparator input 218A is higher than the signal at second comparator input 218B as $V_{C1}$ is charging. As $V_{C1}$ discharges, comparator 216 produces a low output signal at 0.0 V. The signal at first comparator input 218A is lower than the signal at second comparator input 218B as $V_{C1}$ is discharging. Therefore, the charging and discharging cycles of $V_{C1}$ shown in waveform 302 produce the oscillating output signal shown in waveform 304.

Figure 4:
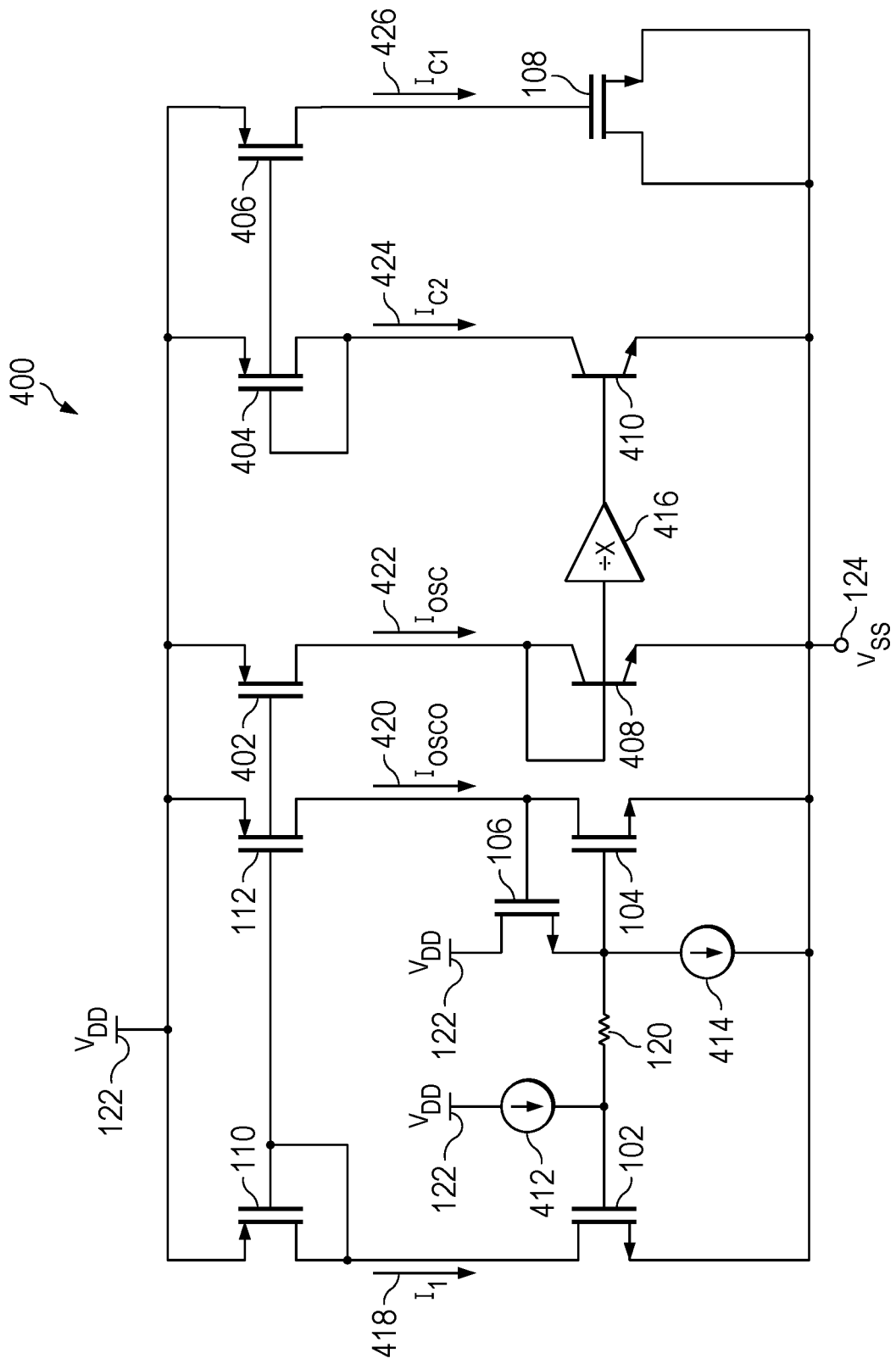
FIG. 4 is a circuit for a relaxation oscillator with a frequency dependent on electron mobility with generic temperature compensation in accordance with various examples.

FIG. 4 is a circuit 400 for a relaxation oscillator with a frequency dependent on electron mobility with generic temperature compensation in accordance with various examples herein. In an example, circuit 400 provides a current to a MOS capacitor. Circuit 400 can compensate for a process electron mobility μ that varies with any temperature coefficient. A divider in the oscillator circuit produces a linear temperature coefficient, which may be compensated by changing a reference voltage of the oscillator.

Circuit 400 includes many of the components of core 100 described above, and also includes components to compensate for a general temperature coefficient X, rather than a temperature coefficient of about 2 or 2.2 in core 100. Circuit 400 includes transistors 102, 104, 106, 108, 110, and 112. Circuit 400 includes resistor 120 and voltage terminals 122 and 124. Circuit 400 also includes transistors 402, 404, 406, 408, and 410. Circuit 400 includes current sources 412 and 414, and divider 416. Circuit 400 also includes a number of currents 418, 420, 422, 424, and 426.

In this example, transistors 102, 104, 106, and 108 are n-channel FETs, and transistors 110, 112, 402, 404, and 406 are p-channel FETs. Transistors 408 and 410 are bipolar-junction transistors (BJTs) in this example. The components of relaxation oscillator 200 that are found in core 100 are configured and operate as described above with respect to FIG. 1. These components include transistors 102, 104, 106, 108, 110, and 112, resistor 120, and voltage terminals 122 and 124. The additional components of circuit 400 are described below.

Circuit 400 includes transistor 402. Transistor 402 has a control terminal (e.g., a gate) coupled to the gate of transistor 112. Transistor 402 has a first terminal (e.g., a drain) coupled to a first terminal (e.g., a collector) of transistor 408. Transistor 402 has a second terminal (e.g., a source) coupled to voltage terminal 122.

Transistor 404 has a control terminal (e.g., a gate) coupled to the gate of transistor 406 and to the first terminal (e.g., a drain) of transistor 404. The first terminal of transistor 404 is also coupled to a first terminal (e.g., a collector) of transistor 410. Transistor 404 has a second terminal (e.g., a source) coupled to voltage terminal 122.

Transistor 406 has a control terminal (e.g., a gate) coupled to the gate of transistor 404. Transistor 406 has a first terminal (e.g., a drain) coupled to the gate of transistor 108. Transistor 406 has a second terminal (e.g., a source) coupled to voltage terminal 122.

Transistor 408 has a base (e.g., a control terminal) coupled to its first terminal (e.g., a collector) and to the input of divider 416. Transistor 408 has a first terminal coupled to the first terminal of transistor 402. Transistor 408 has a second terminal (e.g., an emitter) coupled to voltage terminal 124.

Transistor 410 has a base (e.g., a control terminal) coupled to the output of divider 416. Transistor 410 has a first terminal (e.g., a collector) coupled to the first terminal of transistor 404. Transistor 410 has a second terminal (e.g., an emitter) coupled to voltage terminal 124.

Current source 412 has a first terminal coupled to voltage terminal 122, and has a second terminal coupled to the gate of transistor 102 and to resistor 120. Current source 414 has a first terminal coupled to the gate of transistor 104, resistor 120, and the source of transistor 106. Divider 416 has an input coupled to the base of transistor 408 and an output coupled to the base of transistor 410.

Current 418 is the current ($I_1$) through transistor 102. Current 420 is the current ($I_{OSCO}$) through transistor 104. Current 422 is the current ($I_{OSC}$) through transistor 408. Current 424 is the current ($I_{C2}$) through transistor 410. Current 426 is the current ($I_{C1}$) provided to the gate of transistor 108 that charges the MOS capacitor of transistor 108.

In one example, the width to length ratios of transistors 110, 112, 402, 404, and 406 are approximately equal. The width to length ratio of transistor 104 is four times the width to length ratio of transistor 102 in one example.

In one example operation, current source 412 produces an $I_{ZTC}$ (zero temperature coefficient) current. In this example, $I_{ZTC}$ is a bandgap reference current, as shown in Equation (12):

$$I_{ZTC} = \frac{V_{BG}}{R} \quad (12)$$

where $V_{BG}$ is a bandgap voltage reference. Current source 414 produces a current approximately twice that of current source 412 in one example. Therefore, the current from current source 414 is shown in Equation (13):

$$2 * I_{ZTC} = 2 * \frac{V_{BG}}{R} \quad (13)$$

In FIG. 4, current 420 is labeled $I_{OSCO}$. Current 420 is produced by the current mirror of transistors 110 and 112. Current 422 is $I_{OSC}$, and is shown in Equation (14):

$$I_{OSC} = I_{OSCO} * T^X \quad (14)$$

where X is the temperature exponent of the given manufacturing process. With the use of current sources 412 and 414, the current 422 ($I_{OSC}$) is also shown in Equation (15):

$$I_{OSC} = 2 * \mu_o * T^X * \left(C_{OX} * \frac{W_{n1}}{L_{n1}} (I_{ZTC} * R)\right)^2 \quad (15)$$

where μ is electron mobility, X is the temperature exponent of the process, $C_{OX}$ is the oxide capacitance of the process, $W_{n1}$ is the width of transistor 102, $L_{n1}$ is the length of transistor 102, and $I_{ZTC}*R=V_{BG}$ (from Equation (12) above). Therefore, $I_{OSC}$ is defined by a $V_{BG}/R$ current rather than an $I_{PTAT}$ current as described above with respect to FIG. 1.

In FIG. 4, the base to emitter voltage ($V_{BE1}$) of transistor 408 is defined by Equation (16):

$$V_{BE1} = X * V_t * \ln((I_{OSCO} * T)/I_S) \quad (16)$$

where X is the known temperature exponent of the process, $V_t$ is the thermal voltage of transistor 408, and $I_S$ is the saturation current of transistor 408. Because divider 416 divides by X, the base to emitter voltage ($V_{BE2}$) of transistor 410 is $V_{BE1}$ divided by X, as shown in Equation (17):

$$V_{BE2} = V_t * \ln((I_{OSCO} * T)/I_S) \quad (17)$$

where $V_t$ is the thermal voltage of transistor 410, and $I_S$ is the saturation current of transistor 410. Transistors 408 and 410 are the same size in one example, and their thermal voltages and saturation currents may also be similar. Divider 416 therefore removes the temperature exponent X from $V_{BE2}$. With a known temperature exponent X, divider 416 may be designed or programmed to divide by the appropriate value of X. Because divider 416 removes the temperature exponent X from $V_{BE2}$, the current through $V_{BE2}$ (e.g., current 424 $I_{C2}$) no longer has a temperature exponent X. Current 422, as shown above in Equation (15), includes a TX component. Current 424 ($I_{C2}$) is current 422 without the TX component, as shown in Equation (18):

$$I_{C2} = 2 * \mu_o * T * \left(C_{OX} * \frac{W_{n1}}{L_{n1}} (I_{ZTC} * R)\right)^2 \quad (18)$$

Therefore, temperature exponent X for a process may be compensated for with circuit 400.

The current mirror of transistors 404 and 406 provide the current $I_{C2}$ (current 424) to the gate of transistor 108, which is shown in FIG. 4 as current 426 ($I_{C1}$). The change in voltage $\Delta V_{C1}(T)$ at the gate of transistor 108 is provided by Equation (19):

$$\Delta V_{C1}(T) = \frac{2 * \mu_o * T * \frac{W_{n1}}{L_{n1}} (I_{ZTC} * R)^2}{W_{C1} * L_{C1}} \quad (19)$$

where $W_{C1}$ is the width of transistor 108, and $L_{C1}$ is the length of transistor 108.

Figure 5:
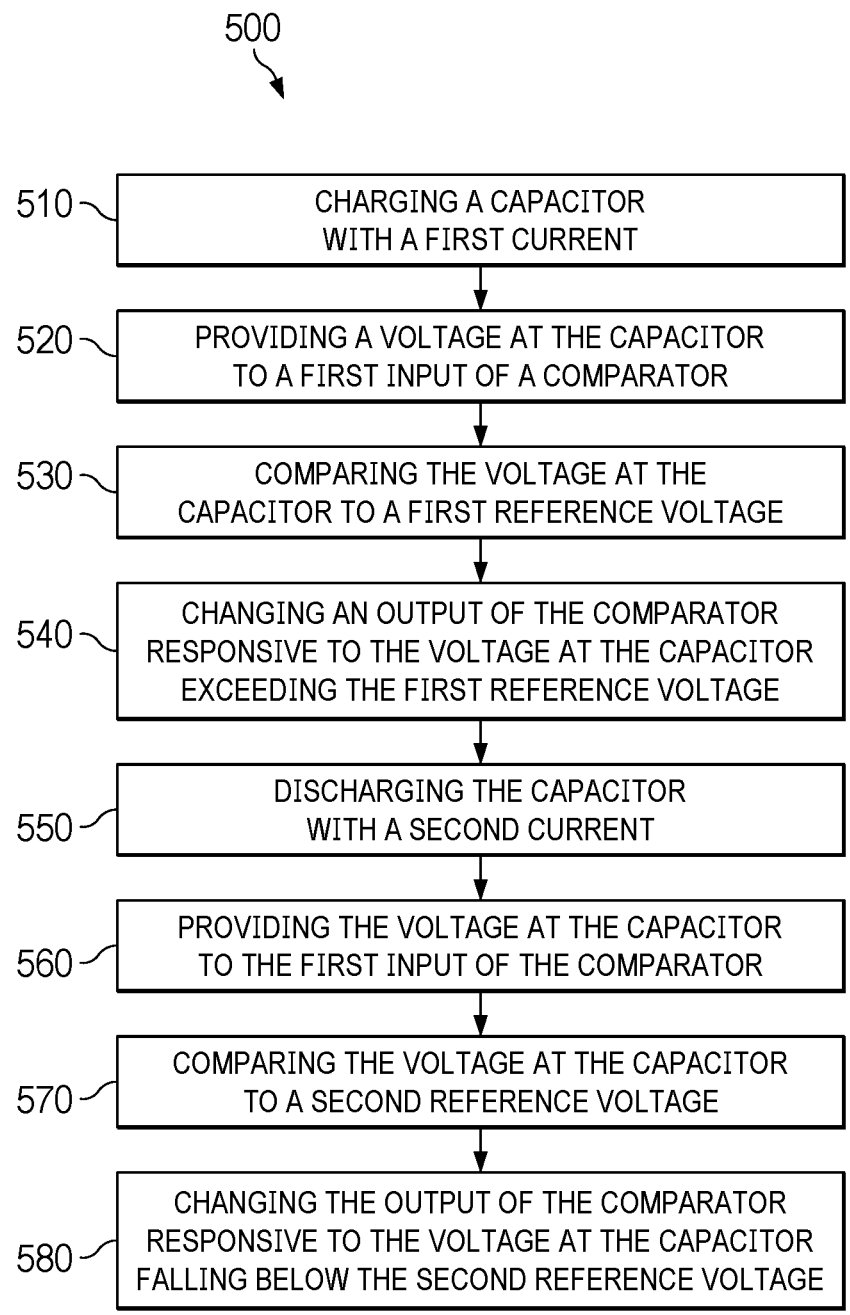
FIG. 5 is a method for providing an oscillating output signal in accordance with various examples.

FIG. 5 is a method 500 for providing an oscillating output signal in accordance with various examples herein. The steps of method 500 may be performed in any suitable order. The hardware components described above with respect to FIG. 2 may perform method 500 in some examples. Any suitable hardware, software, or digital logic may perform method 500 in some examples.

Method 500 begins at 510, where a capacitor is charged with a first current. As an example, current 236 charges transistor 108, which is configured as a MOS capacitor.

Method 500 continues at 520, where a voltage at the capacitor is provided to a first input of a comparator. In one example, the voltage at the gate of transistor 108 is provided to the second input 218B of comparator 216.

Method 500 continues at 530, where the comparator compares the voltage at the capacitor to a first reference voltage. The voltage from the MOS capacitor is compared to the voltage at first input 218A of comparator 216. At this time, the voltage $V_{REF}$ HIGH is provided to first input 218A.

Method 500 continues at 540, where the comparator switches its output responsive to the voltage at the capacitor exceeding the first reference voltage. As the MOS capacitor charges, the voltage at the second input 218B of comparator 216 increases, until it exceeds the voltage $V_{REF\_HIGH}$. At that time, the output of the capacitor switches, and the OUT and OUT_BAR signals also switch. In one example, switches 210 and 228 open, and switches 212 and 230 close.

Method 500 continues at 550, where the capacitor is discharged with a second current. In one example, the second current is current 238, which flows across the closed switch 212 towards transistor 206 and then to voltage terminal 124.

Method 500 continues at 560, where the voltage at the gate of the transistor 108 is again provided to the second input 218B of comparator 216.

Method 500 continues at 570, where the comparator compares the voltage at the gate of transistor 108 to a second reference voltage. At this time, the voltage $V_{REF\_LOW}$ is provided to first input 218A of comparator 216.

Method 500 continues at 580, where the comparator switches its output responsive to the voltage at the capacitor falling below the second reference voltage. As the MOS capacitor discharges, the voltage at the second input 218B of comparator 216 decreases, until it falls below the voltage $V_{REF\_LOW}$. After that time, the output of the comparator 216 switches again.

Although not shown herein, a processor (or controller) may be configured to read and execute computer-readable instructions to perform the examples described herein. For example, the processor may be configured to invoke and execute instructions stored in a memory. In some examples, the processor may be implemented as a generic or custom processor or controller capable of executing instructions stored in a memory. In some examples, the processor may be implemented as an application-specific integrated circuit (ASIC). In some examples, the processor may include one or more of a field programmable gate array (FPGA), a central processor unit (CPU), a graphic processor unit (GPU), a digital signal processor (DSP). In some examples, the processor may include a finite state machine (FSM). Other implementations are also possible.

In some examples, the memory may be integrated with the processor. The memory may be a non-transitory computer-readable medium configured to store various software programs and/or multiple groups of instructions. The memory may be configured to store the instructions for implementing the various methods and processes provided in accordance with the various examples of this description. The memory may be implemented in any way known in the art.

In the examples described herein, a relaxation oscillator architecture is described, where the frequency of the oscillator is dependent on electron mobility (μ) rather than R and C. Electron mobility is a single parameter rather than two parameters (such as R and C), and is more easily controlled for a given manufacturing process. The examples herein also describe a circuit that can compensate for any temperature coefficient of the manufacturing process. A mobility-based oscillator implementation as described herein improves the accuracy of the oscillator. The integration of the temperature compensation is inside the circuit to cancel the electron mobility variation across temperature. In examples herein, an external temperature sensor is not used for temperature compensation. Also, examples herein provide a reduction in test time, test cost, and circuit area for an oscillator circuit due to the elimination of trim bits for the oscillator.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device, or a semiconductor component. Furthermore, a voltage rail or more simply a "rail," may also be referred to as a voltage terminal and may generally mean a common node or set of coupled nodes in a circuit at the same potential.

What is claimed is:

1. A system, comprising:
  a first transistor having a control terminal and first and second terminals, the first terminal coupled to a current mirror and the control terminal coupled to a first current source and a resistor;
  a second transistor having a control terminal and first and second terminals, the first terminal coupled to the current mirror, the second terminal coupled to the second terminal of the first transistor, and the control terminal coupled to the resistor and a second current source;

a third transistor having a control terminal and first and second terminals, the first terminal coupled to a voltage terminal, the second terminal coupled to the control terminal of the second transistor, and the control terminal coupled to the first terminal of the second transistor; and a fourth transistor having a control terminal and first and second terminals, the control terminal coupled to the current mirror, the first and second terminals coupled to one another and to the second terminal of the first transistor and the second terminal of the second transistor.

2. The system of claim 1, wherein the first current source is coupled to the voltage terminal.

3. The system of claim 1, wherein the fourth transistor is configured as a metal-oxide semiconductor (MOS) capacitor.

4. The system of claim 1, further comprising:
a first switch and a second switch coupled to the control terminal of the fourth transistor.

5. The system of claim 4, wherein the first switch is coupled between the control terminal of the fourth transistor and the current mirror, and the second switch is coupled between the control terminal of the fourth transistor and a second current mirror.

6. The system of claim 1, further comprising:
a fifth transistor having a control terminal and first and second terminals, the first terminal coupled to the current mirror, the control terminal coupled to the first terminal, and the second terminal coupled to the second terminal of the first transistor and the second terminal of the second transistor;
a sixth transistor having a control terminal and first and second terminals, the first terminal coupled to a second current mirror, and the second terminal coupled to the second terminal of the first transistor and the second terminal of the second transistor; and
a divider coupled to the control terminal of the fifth transistor and to the control terminal of the sixth transistor.

7. The system of claim 6, wherein the fifth transistor and the sixth transistor are bipolar junction transistors.

8. The system of claim 1, wherein the second transistor is larger than the first transistor.

9. The system of claim 1, wherein the second current source is larger than the first current source.

10. A system, comprising:
a first transistor having a control terminal and first and second terminals, the first terminal coupled to a current mirror and the control terminal coupled to a first current source and a resistor;
a second transistor having a control terminal and first and second terminals, the first terminal coupled to the current mirror, the second terminal coupled to the second terminal of the first transistor, and the control terminal coupled to the resistor and a second current source;
a third transistor having a control terminal and first and second terminals, the first terminal coupled to a voltage terminal, the second terminal coupled to the control terminal of the second transistor, and the control terminal coupled to the first terminal of the second transistor;
a fourth transistor having a control terminal and first and second terminals, the control terminal coupled to the current mirror, the first and second terminals coupled to one another and to the second terminal of the first transistor and the second terminal of the second transistor; and a comparator having a comparator output and first and second comparator inputs, wherein the control terminal of the fourth transistor is coupled to the first comparator input.

11. The system of claim 10, further comprising:
a first switch and a second switch coupled to the control terminal of the fourth transistor.

12. The system of claim 11, further comprising:
a third switch and a fourth switch coupled to the second comparator input, wherein the third switch is coupled to a first voltage reference terminal and the fourth switch is coupled to a second voltage reference terminal.

13. The system of claim 12, further comprising:
an inverter coupled to the comparator output.

14. The system of claim 10, further comprising:
a fifth transistor having a control terminal and first and second terminals, the first terminal coupled to the current mirror, the control terminal coupled to the first terminal, and the second terminal coupled to the second terminal of the first transistor and the second terminal of the second transistor;
a sixth transistor having a control terminal and first and second terminals, the first terminal coupled to a second current mirror, and the second terminal coupled to the second terminal of the first transistor and the second terminal of the second transistor; and
a divider coupled to the control terminal of the fifth transistor and to the control terminal of the sixth transistor.

15. A system, comprising:
a first transistor having a control terminal and first and second terminals, the first terminal coupled to a current mirror and the control terminal coupled to a first current source and a resistor, the first current source configured to provide a proportional to absolute temperature (PTAT) current;
a second transistor having a control terminal and first and second terminals, the first terminal coupled to the current mirror, the second terminal coupled to the second terminal of the first transistor, and the control terminal coupled to the resistor and a second current source;
a third transistor having a control terminal and first and second terminals, the first terminal coupled to a voltage terminal, the second terminal coupled to the control terminal of the second transistor, and the control terminal coupled to the first terminal of the second transistor;
a fourth transistor having a control terminal and first and second terminals, the control terminal coupled to the current mirror, the first and second terminals coupled to one another and to the second terminal of the first transistor and the second terminal of the second transistor, the fourth transistor configured to receive a first current from the current mirror at its control terminal; and
a comparator having a comparator output and first and second comparator inputs, wherein the control terminal of the fourth transistor is coupled to the first comparator input, and wherein the comparator is configured to compare a voltage at the control terminal of the fourth transistor to a reference voltage.

16. The system of claim 15, wherein the fourth transistor is further configured to provide an oscillating output signal at its control terminal.

17. The system of claim 16, further comprising:
a first switch and a second switch coupled to the control terminal of the fourth transistor.

18. The system of claim 17, further comprising:
an inverter coupled to the comparator output.

19. The system of claim 18, wherein the comparator is configured to provide a first output signal and the inverter is configured to provide a second output signal, wherein the first output signal is configured to control the first switch and the second output signal is configured to control the second switch.

20. The system of claim 16, wherein a frequency of the oscillating output signal is dependent on electron mobility.

* * * * *